(12) United States Patent
Nakamura et al.

(10) Patent No.: US 11,972,909 B2
(45) Date of Patent: Apr. 30, 2024

(54) CAPACITOR, CONNECTION STRUCTURE, AND METHOD FOR MANUFACTURING CAPACITOR

(71) Applicant: Murata Manufacturing Co., Ltd., Nagaokakyo (JP)

(72) Inventors: Kazutaka Nakamura, Nagaokakyo (JP); Kohei Shimada, Nagaokakyo (JP); Takeshi Furukawa, Nagaokakyo (JP); Shinji Otani, Nagaokakyo (JP); Akitomo Takahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 314 days.

(21) Appl. No.: 17/666,961

(22) Filed: Feb. 8, 2022

(65) Prior Publication Data

US 2022/0165508 A1 May 26, 2022

Related U.S. Application Data

(63) Continuation of application No. PCT/JP2020/024179, filed on Jun. 19, 2020.

(30) Foreign Application Priority Data

Aug. 27, 2019 (JP) .................................. 2019-154763

(51) Int. Cl.
*H05K 1/18* (2006.01)
*H01G 9/00* (2006.01)
(Continued)

(52) U.S. Cl.
CPC ............ *H01G 9/042* (2013.01); *H01G 9/0029* (2013.01); *H01G 9/15* (2013.01); *H05K 1/182* (2013.01); *H05K 2201/10015* (2013.01)

(58) Field of Classification Search
CPC ......... H05K 1/182; H01G 9/042; H01G 9/048
See application file for complete search history.

(56) References Cited

U.S. PATENT DOCUMENTS

| 2008/0102308 A1 | 5/2008 | Doira et al. |
| 2010/0117232 A1 | 5/2010 | Nakao |
| (Continued) | | |

FOREIGN PATENT DOCUMENTS

| JP | S5057942 A | 5/1975 |
| JP | H10154709 A | 6/1998 |
| (Continued) | | |

OTHER PUBLICATIONS

International Search Report in PCT/JP2020/024179, dated Sep. 15, 2020, 2 pages.

*Primary Examiner* — Jeremy C Norris
(74) *Attorney, Agent, or Firm* — Arentfox Shiff LLP

(57) ABSTRACT

A capacitor disposed inside a multilayer substrate that includes a conductive pattern on a surface thereof and an anode portion having a first conductive metal member and a porous portion disposed on a surface of the first conductive metal member, a cathode portion, and a dielectric layer disposed between the anode portion and the cathode portion. Moreover, the anode portion is led out to a surface side of the multilayer substrate by a connection electrode including an alloy layer containing a metal forming the first conductive metal member and a conductive layer disposed on the alloy layer, and in which the connection electrode is connected to the conductive pattern formed on the surface of the multilayer substrate.

20 Claims, 5 Drawing Sheets

(51) Int. Cl.
*H01G 9/04* (2006.01)
*H01G 9/042* (2006.01)
*H01G 9/15* (2006.01)

(56) References Cited

U.S. PATENT DOCUMENTS

2011/0050334 A1  3/2011  Pan et al.
2018/0047517 A1  2/2018  Kanryo et al.

FOREIGN PATENT DOCUMENTS

| | | |
|---|---|---|
| JP | H10270291 A | 10/1998 |
| JP | 2004281750 A | 10/2004 |
| JP | 2008105087 A | 5/2008 |
| JP | 2008130722 A | 6/2008 |
| JP | 2008282835 A | 11/2008 |
| JP | 2012224897 A | 11/2012 |
| WO | 2009001780 A1 | 12/2008 |
| WO | 2016181865 A1 | 11/2016 |

CAPACITOR, CONNECTION STRUCTURE, AND METHOD FOR MANUFACTURING CAPACITOR

CROSS REFERENCE TO RELATED APPLICATIONS

The present application is a continuation of PCT/JP2020/024179 filed Jun. 19, 2020, which claims priority to Japanese Patent Application No. 2019-154763, filed Aug. 27, 2019, the entire contents of each of which are incorporated herein by reference.

TECHNICAL FIELD

The present invention relates to a capacitor, a connection structure, and a method for manufacturing a capacitor.

BACKGROUND

A substrate with an embedded capacitor in which a solid electrolytic capacitor is disposed has been conventionally known.

Japanese Patent Application Laid-Open No. 2008-130722 (hereinafter "Patent Document 1") discloses a substrate with an embedded solid electrolytic capacitor for electrically connecting an aluminum metal layer to a through-hole copper plating layer without an oxide film on a surface of aluminum to obtain a low-resistance connection between the aluminum metal layer as an anode of the solid electrolytic capacitor and the through hole.

Patent Document 1 discloses a substrate with an embedded solid electrolytic capacitor in which a first plating layer and a second plating layer are formed in a through hole. Moreover, a metal plating layer using an alkaline plating solution is formed as the first plating layer on a surface of an anode on an inner wall surface of the through hole, and a metal plating layer is formed as the second plating layer on the whole inner wall surface of the through hole including a surface of a resin insulating layer and a surface of the first plating layer on the inner wall surface of the through hole.

U.S. Patent Publication No. 2011/0050334 (hereinafter "Patent Document 2") discloses a semiconductor device including a packaging substrate in which part or the whole of a passive element such as an inductor and a capacitor is embedded and a voltage control device (hereinafter also referred to as a "voltage regulator") including an active element, such as a switching element. In the semiconductor device disclosed in Patent Document 2, the voltage regulator and a load to which a power supply voltage is to be supplied are mounted on a packaging substrate. The DC voltage adjusted by a voltage adjustment unit is smoothed by the passive element in the packaging substrate and supplied to the load.

Japanese Patent Application Laid-Open No. 2004-281750 (hereinafter "Patent Document 3") discloses a solid electrolytic capacitor array including: a capacitor element group including a plurality of capacitor elements; one or two or more anode terminals respectively connected to one or two or more anode lead-out lines of the capacitor elements in the capacitor element group and led out; one or two or more cathode terminals connected to a cathode layer of the capacitor elements and led out; and an exterior resin layer covering the capacitor elements, in which the anode terminals and the cathode terminals are configured as external terminals.

In Patent Document 1, the alkaline plating solution is used to form the plating layer as the first plating layer while removing an oxide film on a surface layer of aluminum constituting the anode.

In order to remove the oxide film and form the plating layer on the surface layer of aluminum, a treatment such as a zincate treatment is required. In the zincate treatment, a treatment with a strong alkaline aqueous solution, such as a sodium hydroxide aqueous solution, is performed in order to convert an oxide of aluminum into a hydroxide and remove the oxide. A Zn film is formed on the surface from which the oxide film has been removed, and Zn is substituted under a strong acid environment to form a Cu plating layer.

When a strong alkali or a strong acid used in the process of such a treatment remains in a porous portion or the like in the capacitor, the life of the capacitor is reduced, or the substrate provided with the capacitor is deteriorated.

The semiconductor device including the voltage regulator as described in Patent Document 2 is applied to, for example, an electronic device such as a mobile phone and a smartphone. In recent years, downsizing and thinning of electronic devices have been promoted, and accordingly, downsizing of a semiconductor device itself is desired.

However, in the semiconductor device disclosed in Patent Document 2, when the connection distance between the voltage regulator and the load increases, losses due to wiring also increase.

In particular, when a plurality of capacitors are arrayed using the method as disclosed in Patent Document 3, it is difficult to shorten the connection distance from each capacitor to the voltage regulator and the load.

SUMMARY OF THE INVENTION

Accordingly, it is an object of the present invention to provide a capacitor having a structure in which connection reliability of an electrode connected to an anode portion of the capacitor is improved, and a decrease in life of the capacitor and deterioration of a substrate in which the capacitor is provided rarely occur.

Thus, according to one exemplary aspect, a capacitor is disposed inside a multilayer substrate provided with a conductive pattern on a surface thereof and includes an anode portion including a first conductive metal member and a porous portion present on a surface of the first conductive metal member, a cathode portion, and a dielectric layer present between the anode portion and the cathode portion, in which the anode portion is led out to a surface side of the multilayer substrate by a connection electrode including an alloy layer containing a metal forming the first conductive metal member and a conductive layer provided on the alloy layer, and in which the connection electrode is connected to the conductive pattern formed on the surface of the multilayer substrate.

A connection structure according to an exemplary aspect is formed by connecting aluminum and another metal other than aluminum via an aluminum-containing alloy layer.

Moreover, a method for manufacturing a capacitor according to an exemplary aspect includes providing a metal layer containing a metal different from a metal forming a first conductive metal member on a surface of the first conductive metal member; forming an alloy layer containing the metal forming the first conductive metal member and the metal contained in the metal layer by irradiating the metal layer with laser light; and forming a connection electrode by providing a conductive layer on the alloy layer to lead out the connection electrode to a surface side of a multilayer substrate.

The exemplary embodiments of the present invention provide a capacitor having a structure in which connection reliability of an electrode connected to an anode portion of the capacitor is increased, and a decrease in life of the capacitor and deterioration of a substrate in which the capacitor is provided rarely occur.

DETAILED DESCRIPTION

An exemplary embodiment of a capacitor of the present invention will be described below.

In general, it is noted that the present invention is not limited to the following configuration and can be appropriately modified and applied without changing the gist of the present invention. A combination of two or more individual desirable configurations of the present invention described below is also the present invention.

Each exemplary embodiment discussed below is an example, and it goes without saying that partial replacement or combination of configurations shown in different embodiments is possible as should be appreciated to those skilled in the art.

A capacitor according to an exemplary embodiment is a capacitor disposed inside a multilayer substrate provided with a conductive pattern on a surface thereof.

In the present specification, the multilayer substrate including the capacitor of the exemplary embodiment is referred to as a substrate with an embedded capacitor.

The substrate with an embedded capacitor includes the multilayer substrate provided with the conductive pattern on the surface thereof and the capacitor provided inside the multilayer substrate.

The substrate with an embedded capacitor will be described below with reference to the drawings.

Figure 1:
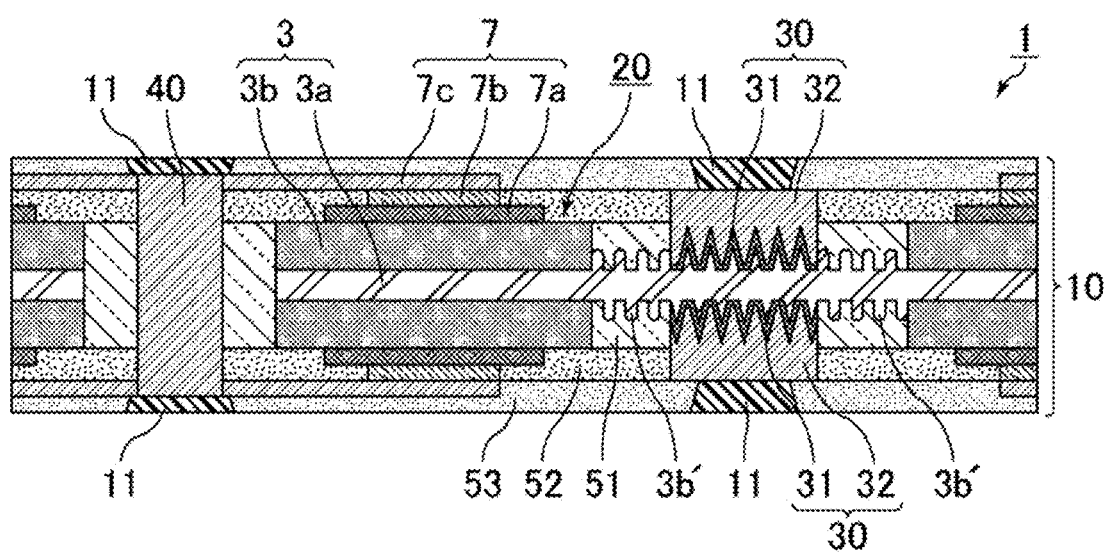
FIG. 1 is a sectional view schematically showing an example of a configuration of a substrate with an embedded capacitor including a capacitor of an exemplary embodiment.

FIG. 1 is a sectional view schematically showing an example of a configuration of the substrate with an embedded capacitor including the capacitor of the exemplary embodiment.

As shown in FIG. 1, a substrate 1 is provided with an embedded capacitor that includes a capacitor 20 inside a multilayer substrate 10.

Conductive patterns 11 are disposed on surfaces of the multilayer substrate 10, and connection electrodes 30 on the anode side and a through hole 40 on the cathode side are provided inside the multilayer substrate 10.

The connection electrodes 30 are electrically connected to an anode portion 3 of the capacitor 20, and the connection electrodes 30 are further connected to the conductive patterns 11 and led out to the surfaces of the substrate 1 with an embedded capacitor.

The through hole 40 is electrically connected to cathode portions 7 of the capacitor 20, and the through hole 40 is further connected to the conductive patterns 11 and led out to the surfaces of the substrate 1 with an embedded capacitor.

In addition to these portions, the multilayer substrate 10 also includes first resin insulating layers 51, second resin insulating layers 52, and surface-layer resin insulating layers 53.

As shown in FIG. 1, the capacitor of the present invention is disposed inside the multilayer substrate. Therefore, by electrically connecting at least one of a voltage regulator and a load to the conductive patterns 11 formed on the surfaces of the multilayer substrate 1, the wiring length of the whole power supply circuit can be shortened.

Therefore, in the capacitor of the exemplary embodiment, at least one of the load and the voltage regulator is preferably electrically connected to the conductive patterns 11 formed on the surfaces of the multilayer substrate 1.

In the capacitor of the exemplary embodiment, when at least one of the load and the voltage regulator is electrically connected to the conductive patterns 11 formed on the surfaces of the multilayer substrate 1, the capacitor exerts an excellent function as part of a power distribution network (PDN).

An example of a configuration of the capacitor forming the substrate with an embedded capacitor will be described below.

The capacitor 20 includes the anode portion 3 including a first conductive metal member 3a and porous portions 3b existing on surfaces of the first conductive metal member 3a.

In the exemplary aspect, dielectric layers (not illustrated) are formed on surfaces of the porous portions 3b.

Further, since pores of the porous portions 3b are filled with part of solid electrolyte layers 7a of the cathode portions, the portions shown as the porous portions 3b in FIG. 1 are actually portions where the porous portions 3b, the dielectric layers on the surfaces thereof, and the solid electrolyte layers 7a of the cathode portions are present.

As shown, the cathode portions 7 face the anode portion 3 with the dielectric layers interposed therebetween, and capacitance exists between the cathode portions 7 and the anode portion 3.

The cathode portions 7 are formed by laminating the solid electrolyte layers 7a formed on the dielectric layers, conductive layers 7b formed on the solid electrolyte layers, and cathode lead-out layers 7c formed on the conductive layers.

The capacitor of the exemplary embodiment in which the solid electrolyte layers are provided as part of the cathode portions can be considered a solid electrolytic capacitor.

In the capacitor 20, the anode portion 3 and the cathode portions 7 are provided in a vertically symmetrical structure (i.e., in the vertical or thickness direction) with the first conductive metal member 3a as the center.

For the first conductive metal member 3a, a metal configured to function as a valve metal can be used.

As the valve metal, for example, at least one metal selected from the group consisting of Al, Ti, Zr, Si, Hf, Y, Mo, W, Ta, Nb, and V is preferably used.

In addition, an alloy containing these metals may be used.

Among these materials, aluminum (Al) or an aluminum alloy is preferable. The capacitor using aluminum for the first conductive metal member is an aluminum solid electrolytic capacitor.

The shape of the first conductive metal member is not particularly limited, but is preferably a flat plate shape, more preferably a foil shape. The porous portions are preferably etched layers etched with hydrochloric acid or the like.

The thickness of each porous portion is designed according to withstand voltage and capacitance required for the capacitor.

When the first conductive metal member is made of aluminum, the porous portions are preferably etched layers formed by etching aluminum.

In the exemplary embodiment, the anode portion of the capacitor is led out to the surface sides of the multilayer substrate by the connection electrodes each including an alloy layer containing a metal forming the first conductive metal member and a conductive layer provided on the alloy layer. Details of the configuration for leading out the anode portion will be described later.

Moreover, in an exemplary aspect, the dielectric layers are preferably formed of oxide films of the valve metal. For example, when an aluminum foil is used as the valve metal, oxide films serving as the dielectric layers can be formed by performing anodization in an aqueous solution containing boric acid, phosphoric acid, adipic acid, or a sodium salt or ammonium salt thereof.

The dielectric layers are formed along the surfaces of the porous portions to form pores (e.g., recesses). The thickness of each dielectric layer is designed according to withstand voltage and capacitance required for the capacitor.

Examples of the material forming the solid electrolyte layers include a conductive polymer having pyrroles, thiophenes, anilines, or the like as a skeleton. Examples of the conductive polymer having thiophenes as a skeleton include poly(3,4-ethylenedioxythiophene) (PEDOT), which may be complexed with polystyrene sulfonic acid (PSS) as a dopant to form PEDOT: PSS.

The thickness of each solid electrolyte layer is preferably 2 μm or more and preferably 20 μm or less.

The conductive layers are provided to electrically and mechanically connect the solid electrolyte layers and the cathode lead-out layers. For example, a carbon layer, a graphene layer, or a silver layer formed by applying a conductive paste such as a carbon paste, a graphene paste, and a silver paste is preferable. In addition, a composite layer in which a silver layer is provided on a carbon layer or a graphene layer or a mixed layer in which a carbon paste or a graphene paste is mixed with a silver paste may be employed.

The cathode lead-out layers can be formed of metal foils or printed electrode layers.

In the case of metal foils, the metal foils are preferably made of at least one metal selected from the group consisting of Al, Cu, Ag, and alloys containing these metals as main components. When the metal foils are made of the above metal, the resistance value of the metal foils can be reduced, and the ESR can be reduced.

As each metal foil, a metal foil having a surface coated with carbon or titanium by a film forming method, such as sputtering and vapor deposition, can be used. More preferably, a carbon-coated Al foil is used in an exemplary aspect.

In the case of the printed electrode layer, the cathode lead-out layer can be formed in a predetermined region by forming an electrode paste on the conductive layer by sponge transfer, screen printing, spray coating, dispensing, inkjet printing, or the like. The electrode paste is preferably an electrode paste containing Ag, Cu, or Ni as a main component.

The cathode lead-out layers 7c are connected to the through hole 40. Moreover, the through hole 40 is connected to the conductive patterns 11 on the surfaces of the multilayer substrate 10, so that the cathode portions 7 are electrically led out to the surfaces of the multilayer substrate 10.

The configuration in which the anode portion of the capacitor is led out to the surface sides of the multilayer substrate by the connection electrodes will be described below in detail.

The first conductive metal member 3a extends to the outside (right side in FIG. 1) of the capacitor portion, and the anode portion is led out to the surface sides of the multilayer substrate 10 by the connection electrodes 30 each including an alloy layer 31 containing a metal forming the first conductive metal member 3a and a plating layer 32 serving as the conductive layer provided on the alloy layer 31. The led-out connection electrodes 30 are connected to the conductive patterns 11 formed on the surfaces of the multilayer substrate 10.

The alloy layer contains a metal forming the first conductive metal member.

The metal forming an alloy with the first conductive metal member is preferably copper or nickel.

Moreover, the alloy layer is preferably made of an alloy of aluminum as the first conductive metal member and copper or nickel.

A plating layer cannot be provided on aluminum because aluminum usually has a natural oxide film on the surface, but a plating layer can be disposed on the alloy layer by providing an alloy layer on the surface of aluminum.

In addition, by providing the alloy layer on the surface of aluminum, a natural oxide film can be provided from being formed on the surface of aluminum.

Therefore, by providing a plating layer on the surface of aluminum, the anode portion of the capacitor using aluminum for the first conductive metal member can be led out to the outside using the plating layer.

In an exemplary aspect, the thickness of the alloy layer is preferably 50 nm or more and 3 μm or less. The thickness of the alloy layer is sufficient as long as bondability to the conductive layer can be secured.

When an alloy layer of copper and aluminum is formed, $AlCu_2$ is formed. This alloy has a low specific resistance of $10^{-6}\Omega$, which is preferable for securing bondability to the conductive layer.

The conductive layer is electrically connected to the alloy layer and serves as a layer that leads out the anode portion in the thickness direction.

The conductive layer is preferably a plating layer provided on the alloy layer.

When the conductive layer is a plating layer, it is preferable that irregularities be formed on the surface of the alloy layer and that the plating layer intrude into the irregularities of the alloy layer.

The irregularities of the surface of the alloy layer preferably have a surface roughness (Ra) of 1 μm or more and 20 μm or less.

With such a structure, the connection strength between the alloy layer and the plating layer is improved by the anchor effect, so that the connection reliability between the anode portion and the connection electrode can be improved.

When the first conductive metal member is made of aluminum, the alloy layer can be formed by performing laser processing on the surface of aluminum provided with the porous portion and the natural oxide film on the surface, providing a metal layer containing a metal constituting the alloy layer by a method such as application of a metal paste and sputtering, and irradiating the metal layer with laser light.

In this process, the oxide film on the surface layer of aluminum can be removed to form the alloy layer made of aluminum as the first conductive metal member and the other metal.

Since it is not necessary to use a strong acid or a strong alkali in this process, the strong alkali or the strong acid does not remain in the porous portion or the like in the capacitor. Therefore, a capacitor is provided having a structure that hardly causes a decrease in life of the capacitor or deterioration of the substrate in which the capacitor is provided.

The connection electrodes are preferably formed so as to sandwich the anode portion from above and below in the thickness direction of the multilayer substrate.

When the connection electrodes sandwich the anode portion from above and below in the thickness direction of the multilayer substrate, a force in the thickness direction applied to the anode portion can be dispersed, and the connection strength between the anode portion and the connection electrodes is improved.

FIG. 1 shows a mode in which the first conductive metal member 3a, which forms the anode portion of the capacitor 20, is sandwiched between the connection electrodes 30 on upper and lower sides in the thickness direction.

As resin insulating layers included in the multilayer substrate, FIG. 1 shows the first resin insulating layers 51, the second resin insulating layers 52, and the surface-layer resin insulating layers 53.

As further shown, the first resin insulating layers 51 are provided adjacent to the connection electrodes 30 and are resin insulating layers with which altered porous portions (also referred to as pores) 3b' existing on the surfaces of the first conductive metal member 3a are impregnated.

The altered porous portions 3b' are porous portions altered by performing laser processing on the original porous portions 3b. Moreover, in the altered porous portions 3b', the porous portions are altered by laser processing and are easily impregnated with the insulating resin.

The second resin insulating layers 52 are provided on the first resin insulating layers 51 and are formed at the same height as the solid electrolyte layers 7a and the conductive layers 7b of the cathode portions.

When the first resin insulating layers and the second resin insulating layers are provided, a plating solution and moisture used for forming the connection electrodes are prevented from penetrating into other portions, and a structure in which deterioration of the capacitor hardly occurs can be obtained.

The surface-layer resin insulating layers 53 are resin insulating layers that are the outermost layers of the substrate 1 with an embedded capacitor.

In an exemplary aspect, the resin forming each resin insulating layer can be, for example, an epoxy resin, a phenol resin, a polyimide resin, a silicone resin, a polyamide resin, a liquid crystal polymer, or the like.

Subsequently, a method for manufacturing a capacitor according to an exemplary embodiment will be described.

A method for manufacturing a capacitor in a substrate with an embedded capacitor in the process of manufacturing the substrate with an embedded capacitor will be described below.

FIGS. 2A, 2B, 2C, and 2D are process diagrams schematically showing an example of a method for manufacturing a substrate with an embedded capacitor.

Figure 2A:
FIGS. 2A, 2B, 2C, and 2D are process diagrams schematically showing an example of a method for manufacturing a substrate with an embedded capacitor.

As shown in FIG. 2A, a valve metal foil 100, such as an aluminum foil, including the porous portions 3b such as the etched layers on the surfaces is provided, and anodization is performed on the surfaces of the porous portions to form the dielectric layers. A portion corresponding to a core portion inside the porous portions 3b is the first conductive metal member 3a.

Figure 2B:
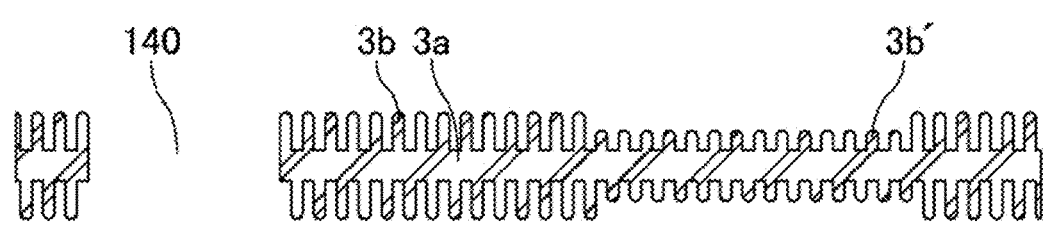

Next, a hole is formed at a position where the through hole is to be formed on the cathode side by laser processing as shown in FIG. 2B to form a cathode side opening 140.

In addition, laser irradiation is performed at positions where the connection electrodes on the anode side are to be formed to melt and remove or alter part of the porous portions. FIG. 2B shows portions irradiated with laser light as the altered porous portions 3b'.

The porous portions are altered by laser irradiation and are easily impregnated with the insulating resin. Specifically, the porosity of the porous portions is reduced by laser irradiation, and the insulating resin easily permeates the porous portions.

Figure 2C:
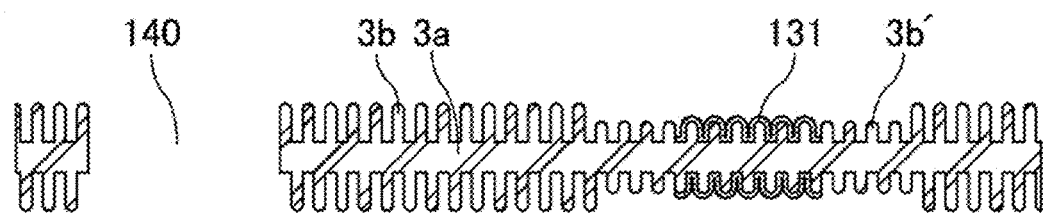

Next, as shown in FIG. 2C, metal layers 131 are provided on part of the altered porous portions 3b', which form the surfaces of the first conductive metal member 3a.

The metal layers contain a metal different from the metal forming the first conductive metal member. When the first conductive metal member is made of aluminum, the metal layers preferably contain copper or nickel.

Examples of the method for providing the metal layers include a method of applying a metal paste containing copper or nickel as a metal to portions that require to be coated and a film forming method such as sputtering.

When the positions where the metal layers are provided are the altered porous portions, copper or nickel easily enter the porous portions because the pore diameter of the pores existing in the porous portions is large, and the contact resistance between the metal layers and the first conductive metal member easily decreases.

When a metal paste containing copper or nickel is used for providing the metal layers, a metal paste is preferably used having metal particles with an average particle diameter of 10 µm or less. The smaller the particle diameter of the metal particles, the easier the sintering is, the lower the melting temperature is, and the more efficiently the diffusion into aluminum and the formation of mixed crystals are performed.

Moreover, the coating thickness of the metal paste is preferably 3 µm or less.

If the coating thickness of the metal paste is too great, heat is less likely to be transferred to the first conductive metal member in the subsequent process of forming the alloy layers by laser irradiation, and the alloy layers may not be formed well.

Figure 2D:
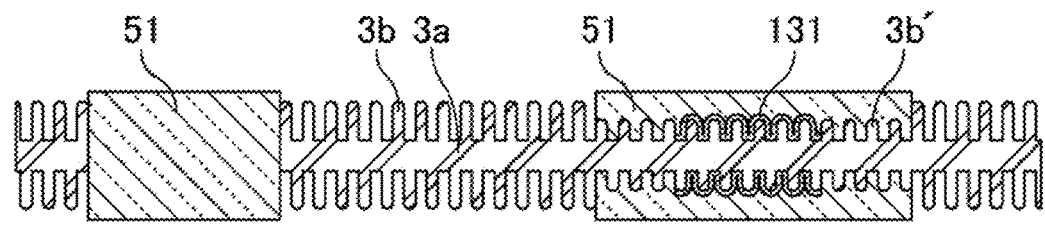

Next, as shown in FIG. 2D, an insulating resin is applied to the inside of the cathode side opening 140 and portions corresponding to the surfaces of the altered porous portions 3b' and the surfaces of the metal layers 131 except for a portion to be a capacitor and cured to form the first resin insulating layers 51.

Figure 3A:
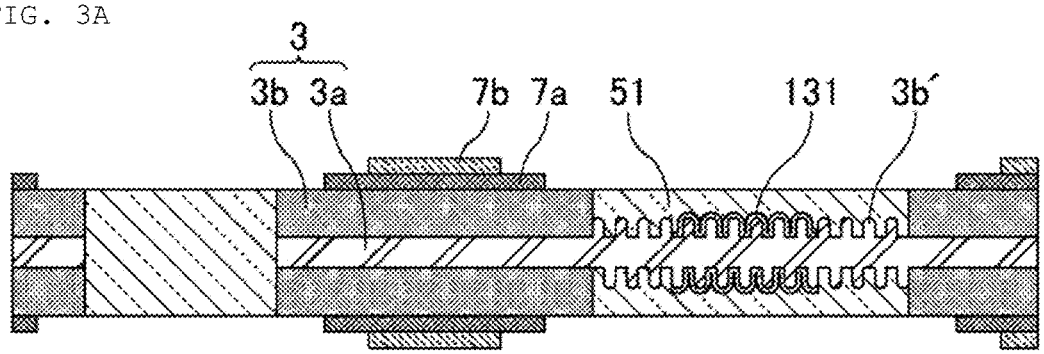
FIGS. 3A, 3B, and 3C are process diagrams schematically showing the example of the method for manufacturing a substrate with an embedded capacitor.
Figure 3B:
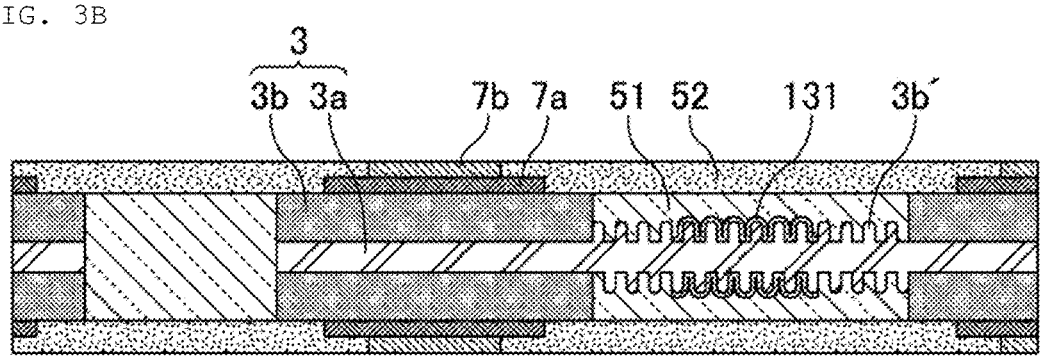
Figure 3C:
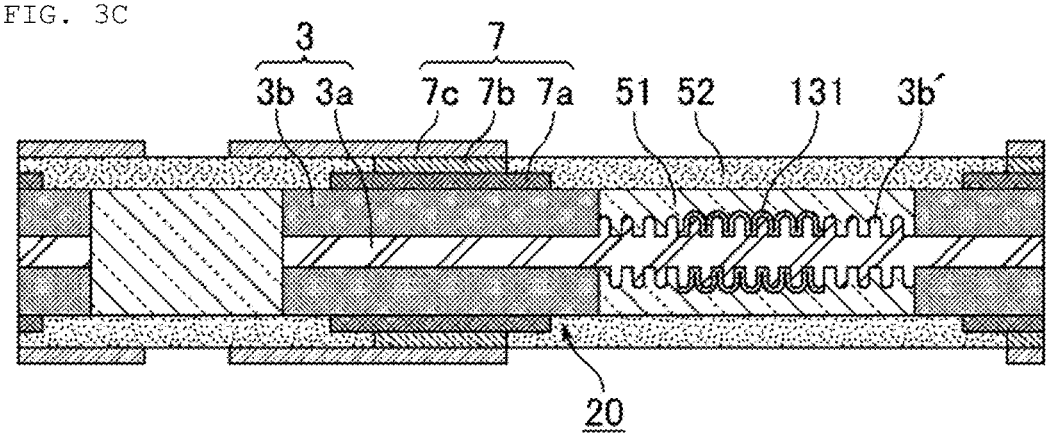

FIGS. 3A, 3B, and 3C are process diagrams schematically showing the example of the method for manufacturing a substrate with an embedded capacitor.

Subsequently, the cathode portions are formed in a portion to be the capacitor.

As shown in FIG. 3A, the solid electrolyte layers 7a and the conductive layers 7b are formed at portions where the first resin insulating layers 51 are not formed and where the porous portions 3b provided with the dielectric layers on the surface are exposed.

FIG. 3A illustrates a state in which the solid electrolyte layers 7a are filled in pores of the porous portions 3b by changing hatching indicating the porous portions 3b. In addition, the solid electrolyte layers 7a and the conductive layers 7b further provided on the porous portions 3b are shown.

In an exemplary aspect, the solid electrolyte layers can be formed by, for example, a method of forming a polymerized film of poly (3,4-ethylenedioxythiophene) or the like on the surfaces of the dielectric layers using a treatment solution containing a monomer such as 3,4-ethylenedioxythiophene, a method of applying a dispersion liquid of a polymer such as poly (3,4-ethylenedioxythiophene) on the surfaces of the dielectric layers and drying the dispersion liquid, or the like. Preferably, solid electrolyte layers are formed for outer layers that cover the whole dielectric layers after forming solid electrolyte layers for inner layers that fill pores of the porous portions.

The solid electrolyte layers can be formed in predetermined regions by applying the above-mentioned treatment liquid or dispersion liquid onto the dielectric layers by sponge transfer, screen printing, spray coating, dispensing, inkjet printing, or the like.

The conductive layers can be provided by forming a conductive paste such as a carbon paste on the solid electrolyte layers by sponge transfer, screen printing, spray coating, dispensing, inkjet printing, or the like.

Next, as shown in FIG. 3B, the second resin insulating layers 52 are provided on the first resin insulating layers 51, the solid electrolyte layers 7a, and the conductive layers 7b.

As shown, by providing the second resin insulating layers 52, portions forming the cathode portions below the conductive layers 7b are protected by the resin insulating layers.

Next, as shown in FIG. 3C, the cathode lead-out layers 7c are provided at predetermined positions. The cathode lead-out layers 7c each have one end connected to the conductive layer 7b and the other end reaching above the second resin insulating layer 52 on the first resin insulating layer 51 filled in the cathode side opening 140. In an exemplary aspect, when the cathode lead-out layer is a metal foil, the cathode lead-out layer can be formed by bonding the metal foil to the conductive layer. A conductive adhesive may be interposed between the metal foil and the conductive layer.

When the cathode lead-out layer is a printed electrode layer, the cathode lead-out layer can be formed in a predetermined region by forming an electrode paste on the conductive layer by sponge transfer, screen printing, spray coating, dispensing, inkjet printing, or the like. The electrode paste is preferably an electrode paste containing Ag, Cu, or Ni as a main component.

Through the steps so far, the capacitor 20 including the cathode portions 7 and the anode portion 3 is obtained.

FIGS. 4A, 4B, 4C, and 4D are process diagrams schematically showing the example of the method for manufacturing a substrate with an embedded capacitor.

Figure 4A:
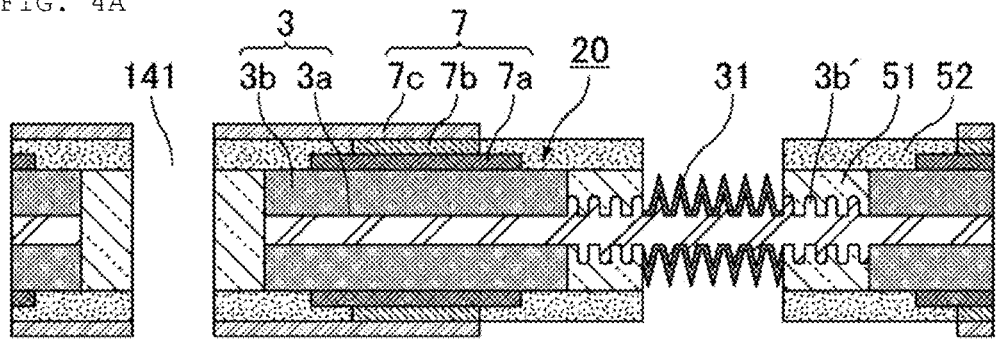
FIGS. 4A, 4B, 4C, and 4D are process diagrams schematically showing the example of the method for manufacturing a substrate with an embedded capacitor.

As shown in FIG. 4A, in a region on the left side in the drawing, the second resin insulating layers 52 and the first resin insulating layers 51 are subjected to an opening treatment to form a cathode side opening 141 for providing a through hole on the cathode side. In an exemplary aspect, the opening treatment can be performed by laser processing.

The opening treatment is performed at a position where ends of the cathode lead-out layers 7c is exposed to the cathode side opening 141.

On the other hand, in the region on the right side in the drawing, the second resin insulating layers 52 and the first resin insulating layers 51 are irradiated with laser light to remove part of the second resin insulating layers 52 and the first resin insulating layers 51, thereby exposing the metal layers 131. Further, laser irradiation is performed on the metal layers 131 to form the alloy layers 31 containing the metal forming the first conductive metal member 3a and the metal contained in the metal layers 131. Removal of the second resin insulating layers 52 and the first resin insulating layers 51 and formation of the alloy layers 31 by laser irradiation may be continuously performed by laser irradiation at a time. Alternatively, laser irradiation for removing the second resin insulating layers 52 and the first resin insulating layers 51 may be performed to expose the metal layers 131, and then another laser irradiation may be performed to form the alloy layers.

The formation of the alloy layers by laser irradiation is performed by a reaction of the metal forming the first conductive metal member with the metal contained in the metal layers by heat generated by laser irradiation.

When the first conductive metal member is made of aluminum and when the metal contained in the metal layers is copper or nickel, the alloy layers are formed by sintering of copper or nickel by heat and diffusing into aluminum with the progress of sintering.

In addition, when the temperature rises to a temperature equal to or higher than the melting point of copper or nickel due to heat generated by laser irradiation, mixed crystals with aluminum due to melting are generated to form the alloy layers.

When copper or nickel is sintered or forms mixed crystals on the surfaces of aluminum, oxidation of the surfaces of aluminum is prevented, and the alloy layers on which the conductive layers can be easily provided in a subsequent step are formed.

When the alloy layers are formed by laser irradiation, the surfaces of the alloy layers are preferably irradiated with laser light so that the surfaces of the alloy layers become rough, and irregularities are formed on the surfaces of the alloy layers by laser irradiation. By forming irregularities on the surfaces of the alloy layers, when the plating layers are formed on the surfaces of the alloy layers, the plating layers intrude into the irregularities of the alloy layers, and the connection strength between the alloy layers and the plating layers is improved by the anchor effect, so that the connection reliability between the anode portion and the connection electrodes is improved.

Examples of the laser used for forming the alloy layers include a fiber laser, a YAG laser, and a $CO_2$ laser.

Laser irradiation conditions are preferably set to an output of 15 W or more and 50 W or less and an irradiation time of 0.01 msec or more and 1 msec or less.

The laser irradiation range is preferably 0.5 mm$^2$ or more and 2 mm$^2$ or less.

Figure 4B:
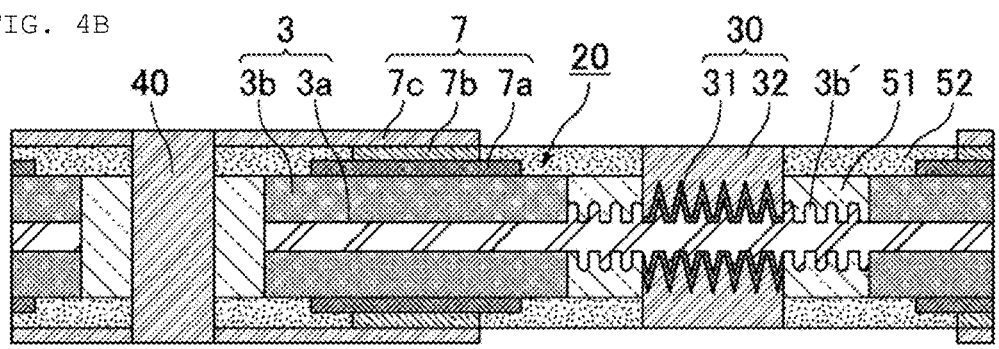

Next, as shown in FIG. 4B, plating treatment is performed to form the through hole 40 in the cathode side opening 141 and form the plating layers as the conductive layers 32 on the alloy layers 31.

The plating treatment can be performed by electroless plating and can also be performed by combining electroless plating and electrolytic plating.

The plating layers are preferably copper plating layers in an exemplary aspect.

The through hole 40 is formed so as to be connected to the cathode lead-out layers 7c. As a result, the cathode portions of the capacitor are led out to the through hole 40.

By forming the plating layers as the conductive layers 32 on the alloy layers 31, the connection electrodes 30 including the alloy layers 31 and the conductive layers 32 are formed. As a result, the anode portion of the capacitor is led out to the connection electrodes 30.

The conductive layers may be conductive layers other than the plating layers or may be conductive layers formed by filling a conductive paste.

Figure 4C:
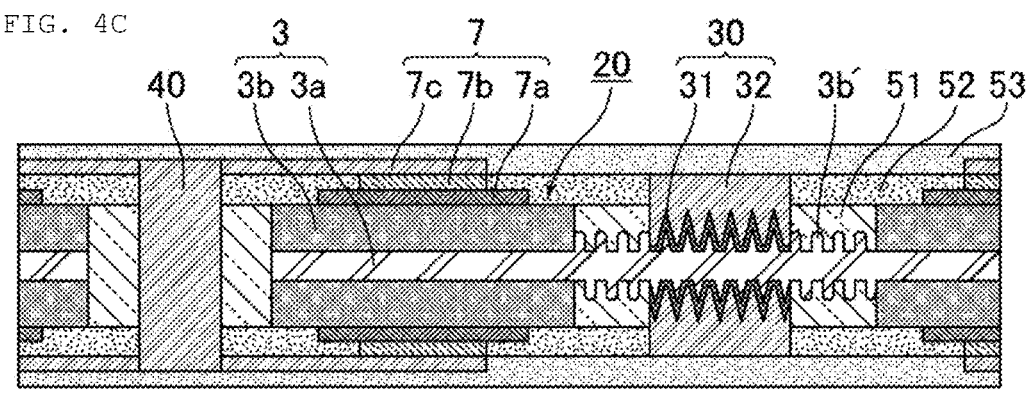
Figure 4D:
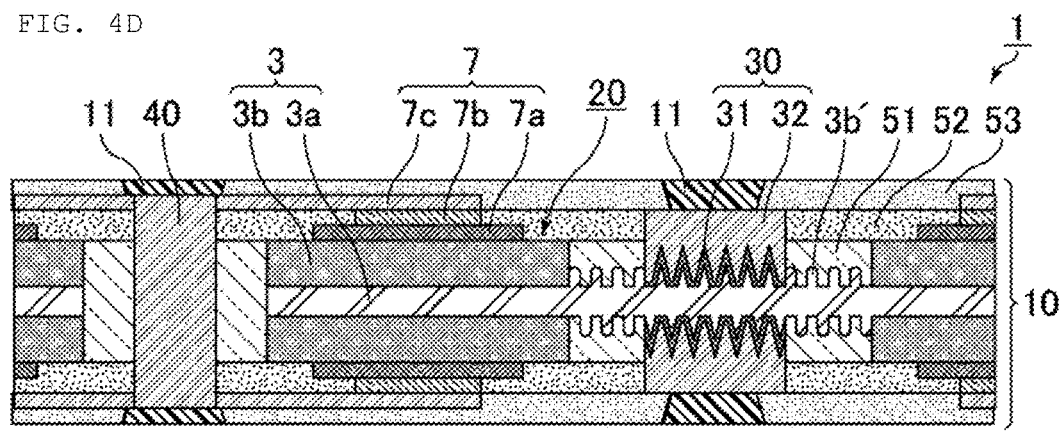

Next, as shown in FIG. 4C, the surface-layer resin insulating layers 53 are formed as the outermost layers, and further, as shown in FIG. 4D, the conductive patterns 11 are formed on the surface-layer resin insulating layers 53.

The surface-layer resin insulating layers 53 can be formed by bonding insulating resin films or applying an insulating resin.

The conductive patterns 11 are connected to the through hole 40 at portions thereof and is connected to the connection electrodes 30 at the other portions thereof. The conductive patterns can be formed on the surface-layer resin insulating layers by a known pattern forming method.

Through the steps so far, the multilayer substrate 10 provided with the conductive patterns on the surfaces is obtained.

As described above, the capacitor 20 is provided inside the multilayer substrate 10.

That is, the capacitor according to the exemplary embodiment can be manufactured in the substrate with an embedded capacitor through the above steps.

In the manufacturing process, the anode portion can be led out to the surface sides of the multilayer substrate without performing the zincate treatment. Since a strong alkali or a strong acid is not used in the above process, a capacitor can be manufactured having a structure that hardly causes a decrease in life of the capacitor or deterioration of the substrate in which the capacitor is provided.

When the plating layers as the conductive layers are provided on the alloy layers, the porous portions in the capacitor are protected by the first resin insulating layers and the second resin insulating layers, so that the plating solution is also prevented from intruding into the porous portions.

In addition, the alloy layers may be formed by a method different from that in the method for manufacturing the capacitor according to the exemplary embodiment described as the above steps. Another mode for forming the alloy layers will be described.

FIGS. 5A, 5B, 5C, and 5D are process diagrams schematically showing an example of another form of forming an alloy layer.

Figure 5A:
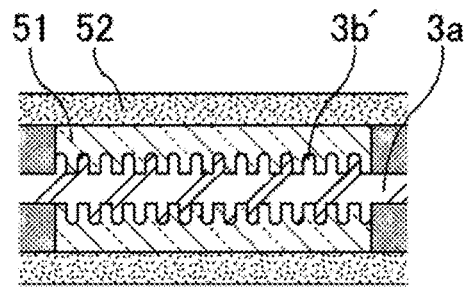
FIGS. 5A, 5B, 5C, and 5D are process diagrams schematically showing an example of another form of forming an alloy layer.

First, as shown in FIG. 5A, the first resin insulating layers 51 and second insulating layers 52 are provided on the altered porous portions 3b' on which the connection electrodes are to be formed.

Figure 5B:
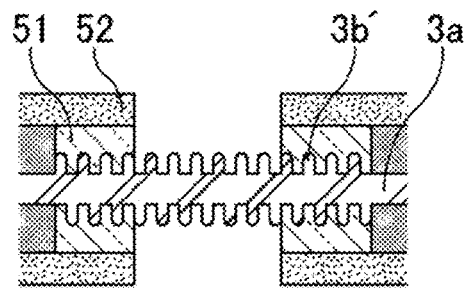

Subsequently, as shown in FIG. 5B, the first resin insulating layers 51 and the second insulating layers 52 are drilled by laser irradiation to expose the altered porous portions 3b'.

Figure 5C:
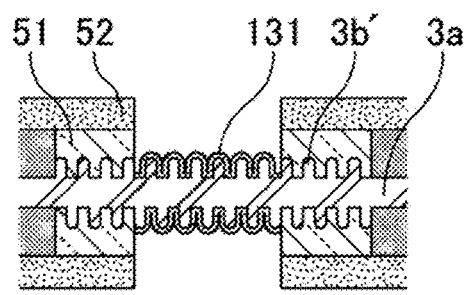

Subsequently, as shown in FIG. 5C, the metal layers 131 are provided on the exposed altered porous portions 3b'.

Figure 5D:
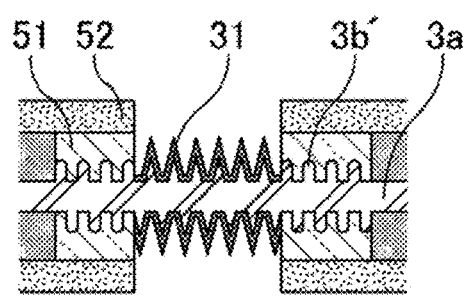

Then, as shown in FIG. 5D, laser irradiation is performed on the metal layers 131 to form the alloy layers 31 containing the metal forming the first conductive metal member 3a and the metal contained in the metal layers 131.

It is noted that the alloy layers can also be formed by such a method.

In the capacitor according to the exemplary embodiment, when the first conductive metal member is made of aluminum, the alloy layers are formed of aluminum and another metal other than aluminum, and aluminum and the conductive layers formed of another metal other than aluminum is connected via the alloy layers.

A connection structure according to an exemplary embodiment is formed by connecting aluminum and another metal other than aluminum via an aluminum-containing alloy layer.

The capacitor according to the exemplary embodiment includes the connection structure according to the embodiment described above.

In the connection structure according to the exemplary embodiment, the alloy layer is an alloy layer containing aluminum. The alloy layer is preferably formed of an alloy of aluminum and copper, an alloy of aluminum and nickel, or an alloy of aluminum and zinc.

As the other metal connected to aluminum via the alloy layer, copper, nickel, silver, or the like is preferable.

In addition, the metal forming the alloy layer with aluminum may be the same as or different from the other metal connected to aluminum via the alloy layer.

Specific examples of the connection structure include the following examples:

Aluminum—an alloy of aluminum and copper-copper
Aluminum—an alloy of aluminum and nickel-copper
Aluminum—an alloy of aluminum and copper-nickel
Aluminum—an alloy of aluminum and nickel-nickel
Aluminum—an alloy of aluminum and zinc-copper It is noted that the use of the connection structure of the exemplary embodiment is not limited to part of the capacitor as long as the connection structure is used such that aluminum and another metal are connected.

For example, ground connection to aluminum for a heat sink, ground connection of an aluminum sash (e.g., electric curtain provision to aluminum sash-used for color change of window glass and the like), and the like can be cited.

When the connection structure is part of a heat sink, the connection structure according to the embodiment can be used as a structure for connecting the other metals to the aluminum heat sink.

Examples of the method for forming the connection structure include a method in which a metal layer containing a metal that forms an alloy layer with aluminum is provided on a surface of aluminum, the metal layer is irradiated with laser light to form the alloy layer containing aluminum and a metal contained in the metal layer, and another metal other than aluminum is connected to the alloy layer.

Examples of the method for connecting the other metal other than aluminum on the alloy layer include electroless plating, electrolytic plating, sputtering, vapor deposition, thermal spraying, application of a conductive paste, bonding with a conductive adhesive, and the like, and the method is not particularly limited.

DESCRIPTION OF REFERENCE SYMBOLS

1: Substrate with embedded capacitor
3: Anode portion
3a: First conductive metal member
3b: Porous portion
3b': Altered porous portion
7: Cathode portion
7a: Solid electrolyte layer
7b: Conductive layer
7c: Cathode lead-out layer 10: Multilayer substrate
11: Conductive pattern
20: Capacitor
30: Connection electrode
31: Alloy layer
32: Plating layer (conductive layer)
40: Through hole
51: First resin insulating layer
52: Second resin insulating layer
53: Surface-layer resin insulating layer
100: Valve metal foil
131: Metal layer
140, 141: Cathode side opening

The invention claimed is:

1. A capacitor disposed inside a multilayer substrate having a conductive pattern on a surface thereof, the capacitor comprising:
an anode portion including a first conductive metal member and a porous portion arranged on a surface of the first conductive metal member;
a cathode portion; and
a dielectric layer disposed between the anode portion and the cathode portion,
wherein the anode portion is led out to the surface of the multilayer substrate by a connection electrode including an alloy layer containing a metal forming the first conductive metal member and a conductive layer disposed on the alloy layer, and
wherein the connection electrode is connected to the conductive pattern disposed on the surface of the multilayer substrate.

2. The capacitor according to claim 1, wherein the connection electrode sandwiches the anode portion from above and below in a thickness direction of the multilayer substrate.

3. The capacitor according to claim 1, wherein the connection electrode includes the alloy layer and a plating layer constructed as the conductive layer.

4. The capacitor according to claim 3, wherein an irregularity is disposed on a surface of the alloy layer, and the plating layer extends into the irregularity.

5. The capacitor according to claim 1, wherein the alloy layer includes an alloy of aluminum and copper or nickel.

6. The capacitor according to claim 1, wherein the first conductive metal member contains aluminum, and the capacitor is an aluminum solid electrolytic capacitor.

7. The capacitor according to claim 1, wherein at least one of a load and a voltage regulator is electrically connected to the conductive pattern disposed on the surface of the multilayer substrate.

8. The capacitor according to claim 1, wherein a through-hole extends in a thickness direction of the multilayer substrate and is connected to the cathode portion and an additional conductive pattern disposed on the surface of the multilayer substrate.

9. The capacitor according to claim 8, further comprising a first resin insulating layer disposed on the anode portion, a second resin insulating layer disposed on the first resin insulating layer, and a surface-layer resin insulating layer disposed on the second resin insulating layers to form the surface of the multilayer substrate.

10. The capacitor according to claim 9, wherein the cathode portion includes a solid electrolyte layer disposed on the porous portion of the anode portion, a conductive layer disposed on the solid electrolyte layer and a cathode lead-out layer extending from the conductive layer and on the first resin insulating layer to the through-hole.

11. A capacitor disposed in a multilayer substrate having at least one conductive pattern disposed on a surface thereof, the capacitor comprising:
an anode having a first conductive metal member with a porous surface;
a cathode having a plurality of layers disposed on opposing sides of the anode;
a dielectric layer disposed between the anode and the cathode; and
a connection electrode that couples the anode to the surface of the multilayer substrate, with the connection electrode including an alloy layer containing a metal of the first conductive metal member and a conductive layer disposed on the alloy layer, and
wherein the connection electrode is connected to the at least one conductive pattern on the surface of the multilayer substrate.

12. The capacitor according to claim 11, wherein the connection electrode sandwiches the anode from above and below in a thickness direction of the multilayer substrate.

13. The capacitor according to claim 11,
wherein the connection electrode includes the alloy layer and a plating layer constructed as the conductive layer, and
wherein an irregularity is disposed on a surface of the alloy layer, and the plating layer extends into the irregularity.

14. The capacitor according to claim 11, wherein the first conductive metal member contains aluminum, and the capacitor is an aluminum solid electrolytic capacitor.

15. The capacitor according to claim 11, wherein at least one of a load and a voltage regulator is electrically connected to the at least one conductive pattern on the surface of the multilayer substrate.

16. The capacitor according to claim 11, wherein a through-hole extends in a thickness direction of the multilayer substrate and is connected to the cathode and the at least one conductive pattern disposed on the surface of the multilayer substrate.

17. The capacitor according to claim 16, further comprising a first resin insulating layer disposed on the anode, a second resin insulating layer disposed on the first resin insulating layer, and a surface-layer resin insulating layer disposed on the second resin insulating layers to form the surface of the multilayer substrate.

18. The capacitor according to claim 17, wherein the plurality of layers of the cathode include a solid electrolyte layer disposed on the porous surface of the anode, a conductive layer disposed on the solid electrolyte layer and a cathode lead-out layer extending from the conductive layer and on the first resin insulating layer to the through-hole.

19. A method for manufacturing a capacitor disposed in a multilayer substrate, the method comprising:
providing a metal layer on a surface of a first conductive metal member with the metal layer being a metal different from a metal forming the first conductive metal member;
irradiating the metal layer with laser light to form an alloy layer containing the metal forming the first conductive metal member and the metal contained in the metal layer by; and
forming a connection electrode by providing a conductive layer on the alloy layer to lead out the connection electrode to a surface of the multilayer substrate.

20. The method for manufacturing the capacitor according to claim 19, further comprising forming a plating layer as the conductive layer by plating the alloy layer.

* * * * *